(12) United States Patent
Takeuchi

(10) Patent No.: US 10,042,400 B2
(45) Date of Patent: Aug. 7, 2018

(54) METHOD AND SYSTEM FOR REMOVING HEAT FROM MULTIPLE CONTROLLERS ON A CIRCUIT BOARD

(71) Applicant: Western Digital Technologies, Inc., Irvine, CA (US)

(72) Inventor: Kevin M Takeuchi, Tustin, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/428,000

(22) Filed: Feb. 8, 2017

(65) Prior Publication Data

US 2017/0147045 A1    May 25, 2017

Related U.S. Application Data

(63) Continuation of application No. 13/943,556, filed on Jul. 16, 2013, now Pat. No. 9,594,410.

(60) Provisional application No. 61/832,702, filed on Jun. 7, 2013.

(51) Int. Cl.
| | |
|---|---|
| *H05K 7/00* | (2006.01) |
| *H05K 5/00* | (2006.01) |
| *G06F 1/20* | (2006.01) |
| *H05K 1/02* | (2006.01) |
| *H05K 7/20* | (2006.01) |

(52) U.S. Cl.
CPC ............... *G06F 1/20* (2013.01); *H05K 1/021* (2013.01); *H05K 7/20172* (2013.01); *H05K 7/20409* (2013.01); *H05K 2201/066* (2013.01)

(58) Field of Classification Search
CPC ....................................................... H05K 7/20
USPC .................................................... 361/679.01
See application file for complete search history.

(56) References Cited

U.S. PATENT DOCUMENTS

| | | | | |
|---|---|---|---|---|
| 5,940,269 A | * | 8/1999 | Ko ......................... | H01L 23/467 165/122 |
| 2006/0061966 A1 | * | 3/2006 | Korinsky .................. | G06F 1/20 361/695 |

\* cited by examiner

*Primary Examiner* — Jerry Wu
(74) *Attorney, Agent, or Firm* — Chang & Hale LLP

(57) ABSTRACT

A heat sink including a top surface, a first bottom surface configured to thermally contact a first controller having a first height from a circuit board, and a second bottom surface configured to thermally contact a second controller having a second height from the circuit board, wherein the second height is different than the first height.

16 Claims, 10 Drawing Sheets

METHOD AND SYSTEM FOR REMOVING HEAT FROM MULTIPLE CONTROLLERS ON A CIRCUIT BOARD

CROSS-REFERENCE TO RELATED APPLICATIONS

This application is a continuation of co-pending and commonly assigned U.S. patent application Ser. No. 13/943,556, filed on Jul. 16, 2013, entitled "METHOD AND SYSTEM FOR REMOVING HEAT FROM MULTIPLE CONTROLLERS ON A CIRCUIT BOARD," which application claims the benefit of U.S. Provisional Application No. 61/832,702, filed on Jun. 7, 2013, entitled "METHOD AND SYSTEM FOR ATTACHMENT OF A HEAT SINK TO A CIRCUIT BOARD," each of which is hereby incorporated by reference in its entirety.

BACKGROUND

In a conventional computer system, a circuit board may include multiple controllers. However, the multiple controllers generally generate a large amount of heat, which the controllers may be unable to sufficiently remove. Without such removal of the heat, the controllers may overheat and be damaged. Thus, heat sinks were generally used with the multiple controllers, with each of the multiple controllers having their own heat sink. However, the use of multiple heat sinks generally increased the size of the circuit board or limited the amount of components which may be placed on the circuit board. Thus, the conventional computer system generally had a larger size to accommodate the increased circuit board size, or it had a reduced performance to accommodate the reduction in heat generation.

If a compromise was utilized, and only one of the controllers had a heat sink, then the other controller may have a reduced performance in order to reduce heat generation by the other controller. Again, this may affect a performance of the conventional computer system.

BRIEF DESCRIPTION OF THE DRAWINGS

The features and advantages of the present embodiments will become more apparent from the detailed description set forth below when taken in conjunction with the drawings, wherein.

DETAILED DESCRIPTION

Figure 1A:
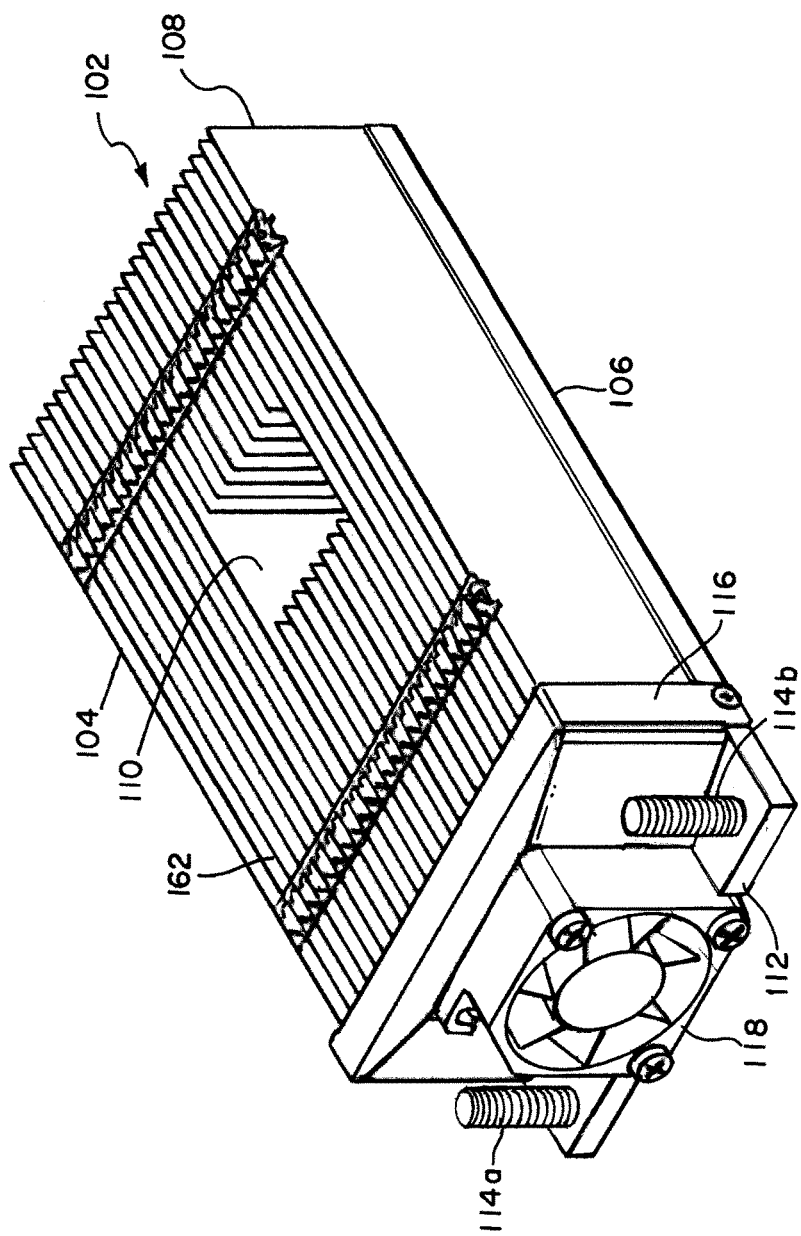
FIG. 1A depicts a top perspective view of a heat sink according to an embodiment.

In an embodiment shown in FIG. 1A, a heat sink 102 is shown. The heat sink 102 can be, for example, a heat sink 102 for a computer system. In an embodiment, the computer system comprises a server, a network attached storage ("NAS") device, a direct attached storage ("DAS") device, a media player appliance, or any other system which may utilize multiple controllers and have a limited amount of circuit board space. In an embodiment, the heat sink comprises a top surface 104, a bottom surface 106, a first side 112, and a second side 108. The heat sink 102 also comprises a plurality of fins 162 on the top surface 104 extending from the first side 112 to the second side 108. Thus, the top surface 104 can comprise ridges formed by the plurality of fins 162. In an embodiment, the heat sink 102 comprises aluminum.

In the embodiment shown in FIG. 1A, a shroud 116 is optionally attached to the first side 112 of the heat sink 102 and a fan 118 is optionally attached to the shroud 116. In an embodiment, the fan 118 is configured to supply air into the shroud 116 to remove heat from the heat sink 102. In an embodiment, the shroud 116 is configured to spread out the air supplied by the fan 118 over the plurality of fins 162. In an embodiment, the use of the shroud 116 to spread out the air supplied by the fan 118 over the plurality of fins 162 can reduce a size of the fan 118 utilized because air will be distributed to fins in the plurality of fins 162 which would not ordinarily be in the path of the fan 118. In an embodiment, the fan 118 can also consume less power since the fan 118 may not need to spin faster in order to supply air to all of the fins in the plurality of fins 162. Furthermore, the reduction in size of the fan 118 can also reduce power consumption by the fan 118.

In the embodiment shown in FIG. 1A, the heat sink 102 is configured to be secured to a circuit board by attachment devices such as attachment devices 114a and 114b. The attachment devices 114a and 114b can be used to secure the heat sink 102 to the circuit board at a peripheral portion of the heat sink 102. In the embodiment shown in FIG. 1A, the peripheral portion of the heat sink 102 comprises the first side 112. In an embodiment, the attachment devices 114a and 114b comprise push pins.

Figure 1B:
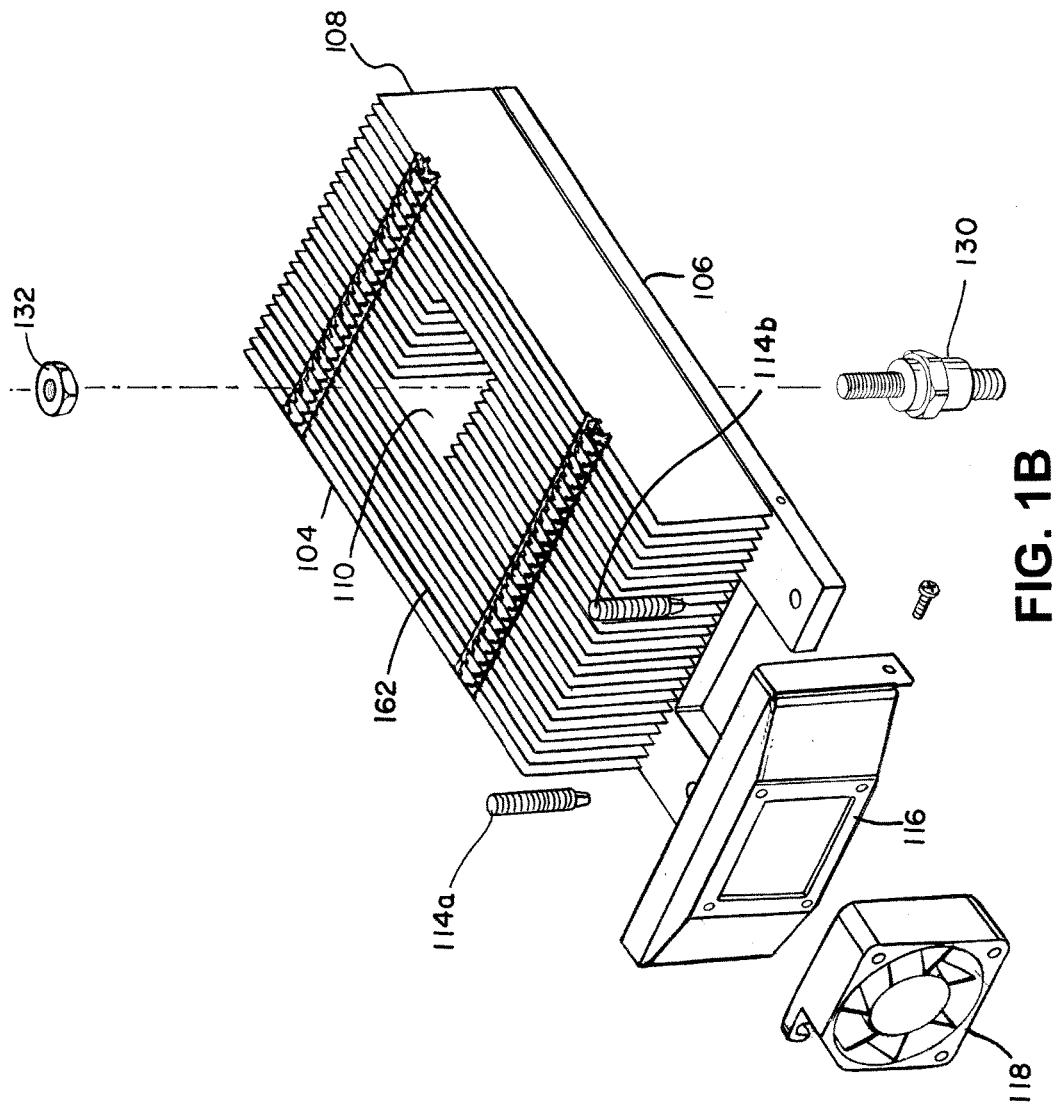
FIG. 1B depicts an exploded top perspective view of a heat sink according to an embodiment.

In the embodiment shown in FIG. 1A, the heat sink 102 also comprises an aperture 110 in a middle portion of the heat sink 102. In the embodiment shown in FIG. 1B, an exploded view of the heat sink 102 is shown. As can be seen in the embodiment shown in FIG. 1B, the heat sink 102 can be secured to the circuit board by a standoff component 130 and a nut 132. In an embodiment, the nut 132 comprises a hex nut. In an embodiment, the nut 132 comprises a self-locking hex nut. In an embodiment, the nut 132 comprises a nylon insert configured to increase rotational friction of the nut 132 and prevent inadvertent rotational movement of the nut 132. In an embodiment, the standoff component 130 and the nut 132 are configured to cooperate with each other to aid in securing the heat sink 102 to the circuit board, which will be described in more detail below.

Figure 2:
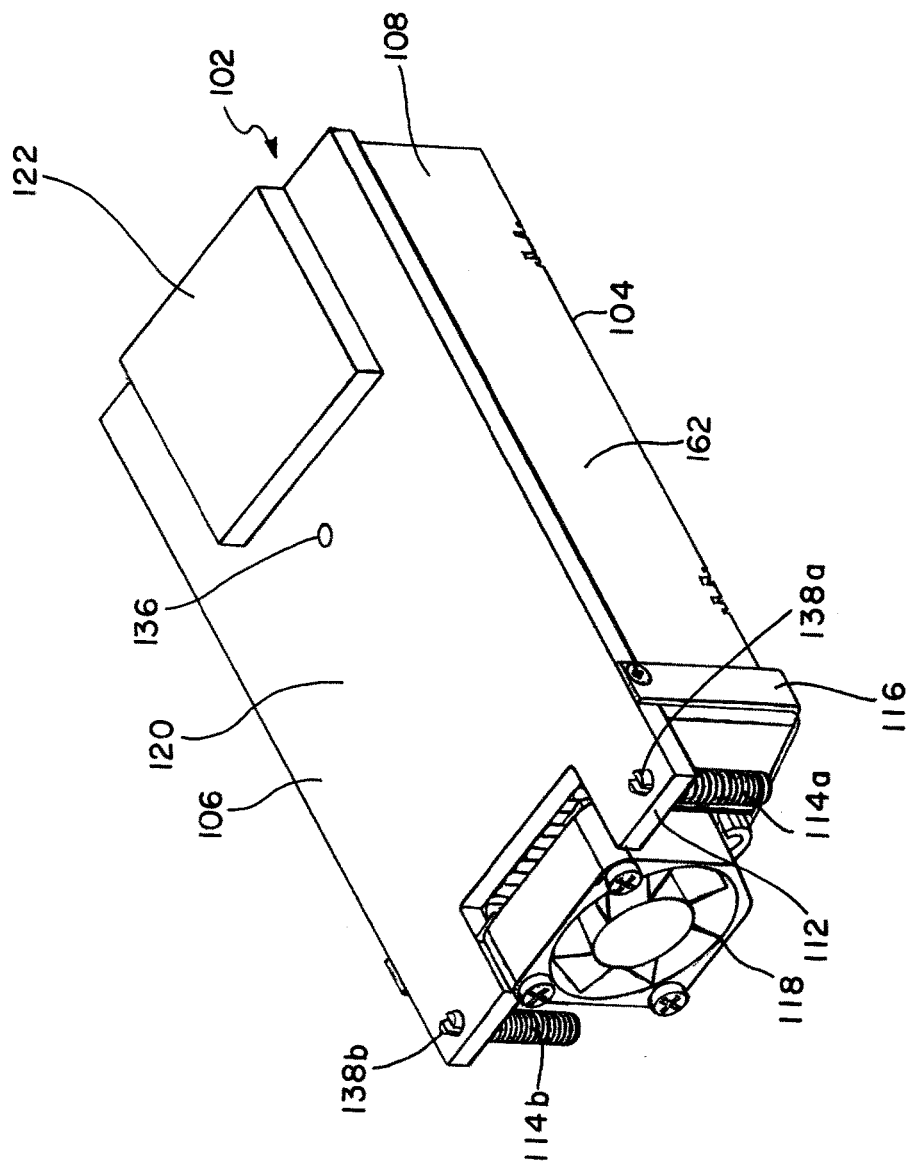
FIG. 2 depicts a bottom perspective view of a heat sink according to an embodiment.

In the embodiment shown in FIG. 2, a bottom side of the heat sink 102 is depicted. As can be seen, the heat sink 102 comprises apertures 138*a* and 138*b*, through which the attachment devices 114*a* and 114*b* can secure the heat sink 102 to the circuit board. Furthermore, the heat sink 102 comprises an aperture 136 through which the standoff component 130 can secure the heat sink 102 to the circuit board 124.

In the embodiment shown in FIG. 2, the bottom surface 106 of the heat sink 102 comprises a first bottom surface 120 and a second bottom surface 122. The first bottom surface 120 comprises a first distance from the top surface 104 and the second bottom surface 122 comprises a second distance from the top surface 104, wherein the first distance is different than the second distance. In an embodiment, the first distance is less than the second distance. In an embodiment, the first bottom surface 120 is configured for thermal contact with a first controller on the circuit board, while the second bottom surface 122 is configured for thermal contact with a second controller on the circuit board, which will be described in more detail below.

Figure 3:
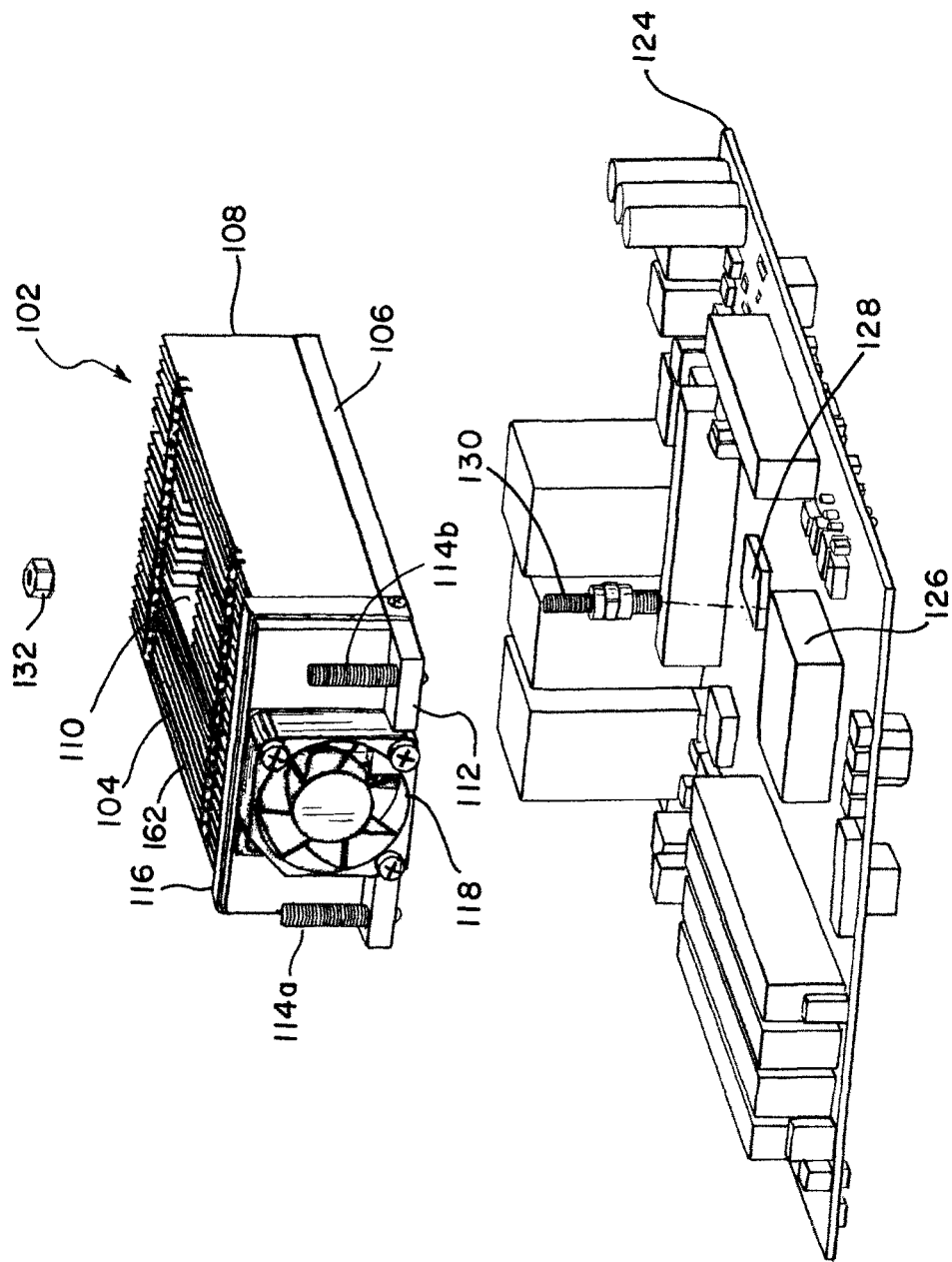
FIG. 3 depicts a perspective view of a heat sink and a circuit board according to an embodiment.
Figure 4:
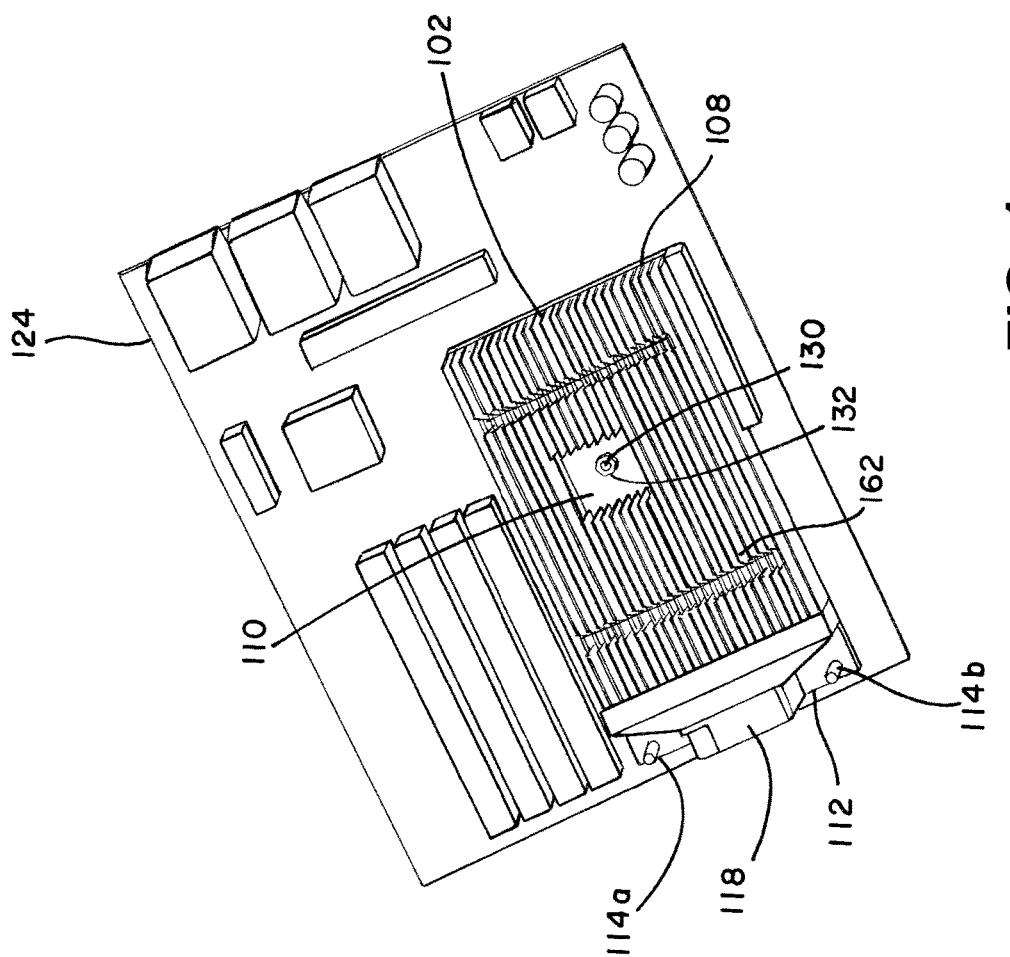
FIG. 4 depicts a heat sink attached to a circuit board according to an embodiment.

In the embodiment shown in FIG. 3, the heat sink 102 is shown over a circuit board 124. As can be seen, the circuit board 124 comprises a first controller 126 and a second controller 128. As previously noted, the heat sink 102 is configured to be secured to the circuit board 124 utilizing the attachment devices 114*a* and 114*b*, the standoff component 130, and the nut 132. In an embodiment, the first bottom surface 120 (FIG. 2) is configured to thermally contact the first controller 126 when the heat sink 102 is secured to the circuit board 124. In an embodiment, the second bottom surface 122 (FIG. 2) is configured to thermally contact the second controller 128 when the heat sink 102 is secured to the circuit board 124. An embodiment shown in FIG. 4 depicts the heat sink 102 when it is secured to the circuit board 124.

In an embodiment, the first controller 126 and the second controller 128 generate different amounts of heat or have different cooling requirements. For example, the first controller 126 may comprise a central processing unit ("CPU") while the second controller 128 may comprise a graphics controller. In an embodiment, the first controller 126 generates more heat than the second controller 128 or requires more cooling than the second controller 128. Thus, the first bottom surface 120 is configured to thermally contact the first controller 126 because the first bottom surface 120 is closer to the fan 118 than the second bottom surface 122. In an embodiment, this increases an amount of heat from the first controller 126 that is removed by the fan 118.

In an embodiment, the fan 118 provides a forced convection environment in order to reject and move heat off higher wattage controller components. In an embodiment, the fan 118 is placed to cool the first controller 126, which generates the most heat, and carry the second hand air to the second controller 128, which generates less heat. All the while, the fan 118 passes this heated air thru the surface of the plurality of fins 162 for a maximum or increased overall air cooling capability and efficiency.

Figure 5:
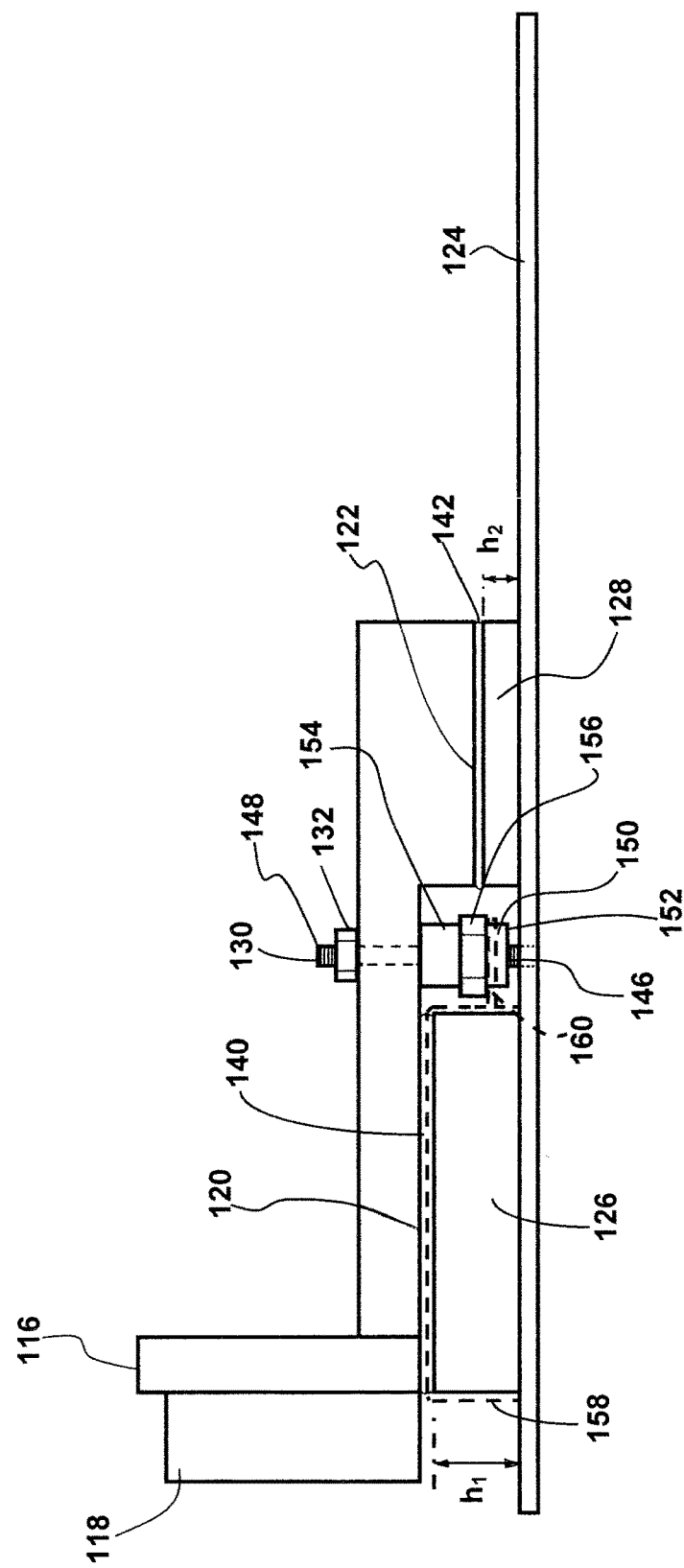
FIG. 5 depicts a partial side view of a heat sink attached to a circuit board according to an embodiment.

In an embodiment shown in FIG. 5, a partial side view of the heat sink 102 secured to the circuit board 124 is depicted. As can be seen, the first controller 126 is a first height h1 from the circuit board 124 while the second controller 128 is a second height h2 from the circuit board 124. In an embodiment, the first height h1 and the second height h2 are different from each other. In an embodiment, the first height h1 is greater than the second height h2. In an embodiment, the first height h1 comprises approximately 7 mm. In an embodiment, the second height h2 comprises approximately 2 mm.

In an embodiment shown in FIG. 5, the first bottom surface 120 is configured to thermally contact the first controller 126 through a first thermal conduction material 140, and the second bottom surface 122 is configured to thermally contact the second controller 128 through a second thermal conduction material 142. In an embodiment, the first thermal conduction material 140 comprises thermal grease while the second thermal conduction material 142 comprises a thermal pad. In an embodiment, since the first controller 126 generates more heat or may require more cooling, the thermal grease is used for the first thermal conduction material 140. This can, for example, allow greater heat transfer between the first controller 126 and the heat sink 102, which results in more heat being removed from the first controller 126. However, in an embodiment, the first thermal conduction material 140 could comprise a thermal pad. Furthermore, in an embodiment, the second thermal conduction material 142 could comprise thermal grease. In an embodiment, the first thermal conduction material 140 or the second thermal conduction material 142 comprises a non-metallic heat conducting material.

In an embodiment, by utilizing a single heat sink 102 for multiple controllers 126 and 128 instead of multiple heat sinks, component placement in the circuit board 124 can be maximized. Furthermore, thermal mass of the heat sink 102 is increased. For example, the thermal mass of the single heat sink may be greater than the thermal mass of multiple heat sinks. Thus, more heat can be removed. In addition, the use of the single heat sink 102 also reduces an amount of circuit board space utilized, which can be beneficial where the amount of circuit board space is limited.

Also shown in the embodiment in FIG. 5 is the standoff component 130. As can be seen in the embodiment shown in FIGS. 3 and 5, the first controller 126 is configured to be located between the one or more attachment devices 114*a* and 114*b* and the standoff component 130 when the heat sink 102 is secured to the circuit board 124. In an embodiment, this produces a three point mounting system for the heat sink 102 and the first controller 126 and allows the heat sink 102 to have a more substantially planar thermal contact with the first controller 126. In an embodiment, the three point mounting system aids in establishing a plane (utilizing three points of contact) and in preventing any sort of skewing and angular misalignment of the heat sink 102 to the surface of the first controller 126.

In an embodiment, this also allows for a reduced amount of bending or bowing of the circuit board 124. For example, in an embodiment, when a heat sink is attached to the circuit board 124, the circuit board 124 may bow or bend, particularly when the heat sink is attached to the circuit board 124 at the ends of the heat sink. The bowing or bending of the circuit board 124 may prevent good thermal contact between the heat sink and one or more of the two or more controllers. However, by utilizing the standoff component 130 at a middle portion of the heat sink 102, the bowing or bending of the circuit board 124 may be reduced for at least a portion of the circuit board 124. This can improve thermal contact between the heat sink 102 and one of the two or more controllers. For example, the portion of the circuit board 124 between the standoff component 130 and the two attachment devices 114*a* and 114*b* may experience less bowing or bending than if the heat sink 102 were attached to the circuit board 124 at the ends of the heat sink 102.

In an embodiment, the standoff component 130 is configured to be located between the first controller 126 and the second controller 128, as shown in FIGS. 3 and 5. The standoff component is shown in more detail in FIGS. 6-9.

Figure 9:
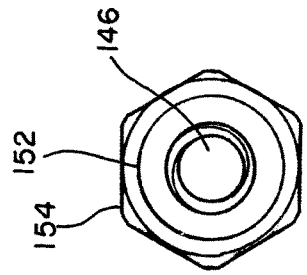
FIG. 9 depicts a bottom view of a standoff component according to an embodiment.
Figure 6:
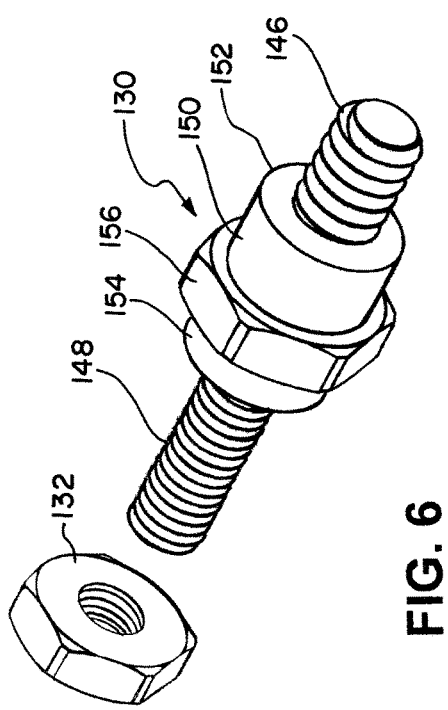
FIG. 6 depicts a perspective view of a standoff component according to an embodiment.
Figure 7:
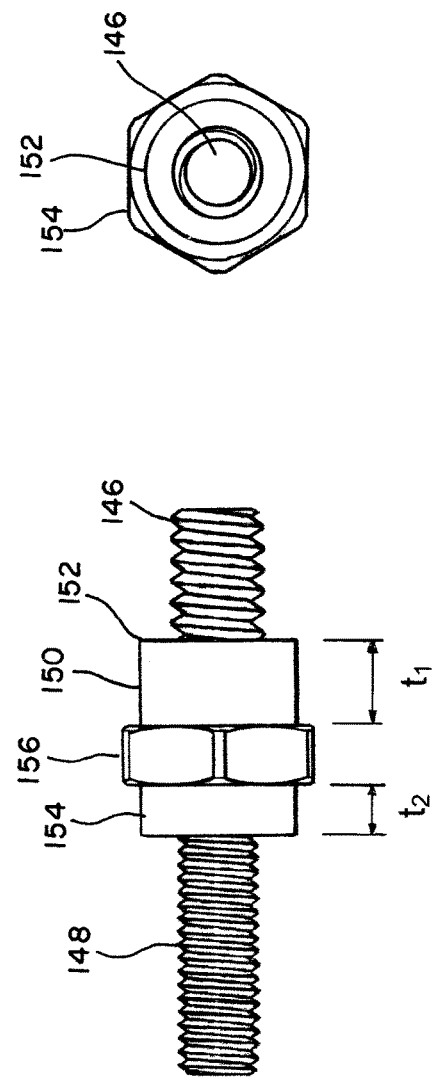
FIG. 7 depicts a side view of a standoff component according to an embodiment.
Figure 8:
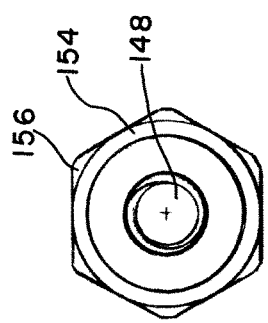
FIG. 8 depicts a top view of a standoff component according to an embodiment.

FIG. 6 depicts a perspective view of the standoff component 130 according to an embodiment. FIG. 7 depicts a side view of the standoff component 130 according to an embodiment. FIG. 8 depicts a top view of the standoff component 130 according to an embodiment. FIG. 9 depicts a bottom view of the standoff component 130 according to an embodiment.

As can be seen in the embodiments shown in FIGS. 6-9, the standoff component comprises a first threaded section 146 configured to secure the standoff component 130 to the circuit board 124 and a second threaded section 148 configured to secure the standoff component 130 to the heat sink 102 at a middle portion of the heat sink 102. In an embodiment, the first threaded section 146 and the second threaded section 148 comprise a unitary piece. However, in an embodiment the first threaded section 146 and the second threaded section 148 comprise separate pieces. In an embodiment, the first threaded section 146 and the second threaded section 148 need not have the same dimensions. For example, the first threaded section 146 and the second threaded section 148 can have different lengths in an axial direction. Furthermore, the first threaded section 146 and the second threaded section 148 can have different diameters.

Furthermore, the standoff component 130 comprises a middle section 150 separating the first threaded section 146 from the second threaded section 148. In an embodiment, the middle section comprises a first collar 152, a second collar 154, and a head section 156. In an embodiment, the head section 156 is configured for insertion and removal of the standoff component 130 using a wrench. In an embodiment the head section 156 comprises a hexagonal shape. In an embodiment, the first collar 152 comprises a first thickness t1 and the second collar 154 comprises a second thickness t2 as shown in an embodiment in FIG. 7.

Referring back to FIG. 5, in an embodiment, when the standoff component 130 is secured to the circuit board, the first collar 152 is configured to allow a spring loaded clip 158 to be secured onto the first controller 126.

Figure 10:
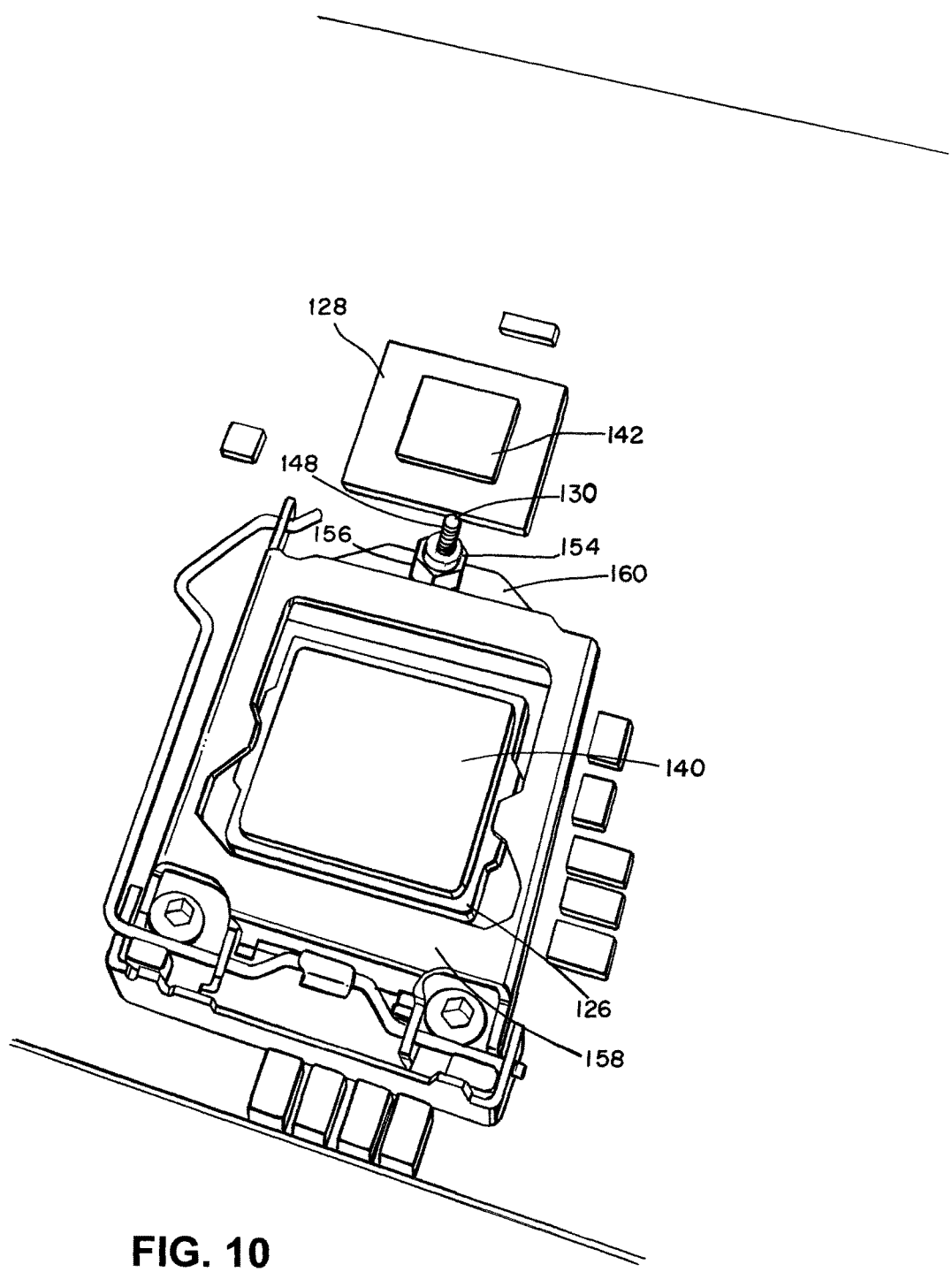
FIG. 10 depicts a circuit board with a first controller, a second controller, and a standoff component according to an embodiment.

While the embodiment in FIG. 5 depicts a side view of the spring loaded clip 158, a perspective view of the spring loaded clip 158 can be seen in the embodiment in FIG. 10. In an embodiment, the spring loaded clip 158 secures the first controller 126 to the circuit board 124 so that the first controller 126 is correctly connected to the circuit board 124. That is, the spring loaded clip 158 frames the first controller 126.

In an embodiment, the spring loaded clip 158 can ensures that pins in the first controller 126 are correctly aligned and making proper contact with corresponding pin reception portions in the circuit board 124. In the embodiment shown in FIG. 10, the spring loaded clip 158 comprises a forked ledge 160, which includes a gap in a middle portion of the forked ledge 160. In an embodiment, the standoff component 130 is configured to be partially placed through the gap. In an embodiment, this allows the spring loaded clip 158 to be secured to the circuit board 124. In an embodiment, this can also prevent the standoff component 130 from being screwed too close to the circuit board 124.

Thus, as can be seen in the embodiment shown in FIG. 5, the first threaded section 146 and the first collar 152 of the standoff component are located between the forked ledge 160 of the spring loaded clip 158 and the circuit board 124. Furthermore, in an embodiment, the second collar 154, and the head section 156 of the standoff component 130 are located between the forked ledge 160 of the spring loaded clip 158 and the heat sink 102. In an embodiment, the second threaded section 148 extends from the second collar 154 and through the heat sink 102 so that it can accept the nut 132. In an embodiment, the second threaded section 148 and the nut 132 cooperate to secure the standoff component 130 to the heat sink 102.

In an embodiment, when the head section 156 is tightened with the wrench, the standoff component 130 is secured to the circuit board 124 and can be prevented from being too close to the circuit board 124 by the forked ledge 160. In addition, when the head section 156 is tightened with the wrench, the standoff component 130 may also aid in securing the spring loaded clip 158 to the circuit board 124.

In an embodiment, when the standoff component 130 and the first controller 126 are secured to the circuit board, the second collar 154 is configured to be approximately at a same height from the circuit board 124 as the first controller 126. Thus, if the first controller 126 is configured to be at the first height h1 from the circuit board 124, then the second collar 154 is configured to be approximately at the first height h1 from the circuit board 124.

In an embodiment, the second thickness t2 of the second collar 154 is configured such that the second collar 154 is approximately at the first height h1 from the circuit board 124. In an embodiment, the first thickness t1 of the first collar 152 is configured such that the second collar 154 is approximately at the first height h1 from the circuit board 124. In an embodiment, a thickness of the head section 156 is configured such that the second collar 154 is approximately at the first height h1 from the circuit board 124.

However, in some embodiments, a height differential may exist due to gaps on top of the first controller 126, an uneven surface on the top of the first controller 126, or bowing of the circuit board 124 or the first controller 126. In such a case, the first thermal conduction material 140 may be used to fill in the height differential.

For example, as shown in FIG. 5, the second collar 154 is configured to be approximately at a same height from the circuit board 124 as the first controller 126, but a height differential exists between the first controller 126 and the heat sink 102. The height differential is filled in with the first thermal conduction material 140. However, it should be noted that the height differential in FIG. 5 is exaggerated so that the first thermal conduction material 140 is more clearly shown.

In an embodiment, when the standoff component and the first controller 126 are secured to the circuit board 124, the second collar 154 is configured to allow the heat sink 102 to have substantially planar thermal contact with the first controller 126. In the embodiment shown in FIG. 5, the heat sink 102 has substantially planar thermal contact with the first controller 126 and the thermal contact is provided through direct contact with the first controller 126, contact with the first thermal conduction material 140, or any combination thereof.

Furthermore, in an embodiment, the use of three apertures instead of four apertures may improve an amount and arrangement of components that may be placed on the circuit board 124. In addition, in an embodiment, the standoff component 130 may also utilize an aperture for attaching the spring loaded clip 158 for mounting the first controller 126 to the circuit board 124, when the first controller 126 is a CPU.

For example, as shown in an embodiment in FIG. 10, the standoff component 130 may be placed adjacent to or on the forked ledge 160 of the spring loaded clip 158 instead of elsewhere. In such a case, an additional aperture may be removed from the circuit board 124 since only a single aperture will be needed for the standoff component 130 instead of an aperture for a fastener to attach the heat sink 102 to the circuit board 124, and a separate aperture for a fastener to attach the spring loaded clip 158 to the circuit board 124. This can also improve an amount and arrangement of components that may be placed on the circuit board 124.

Figure 11:
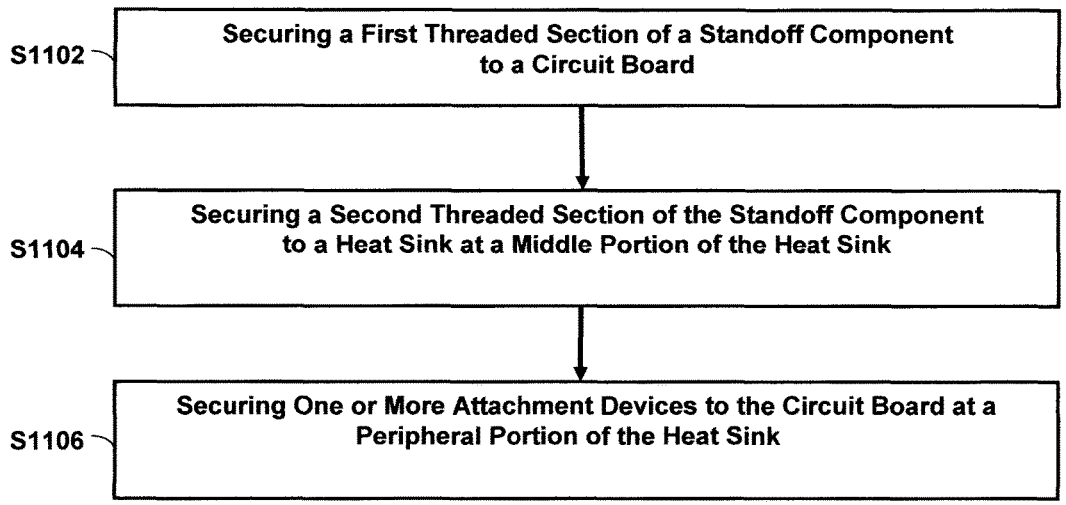
FIG. 11 depicts a process for securing a heat sink to a circuit board according to an embodiment.

In an embodiment, a process for securing the heat sink 102 to the circuit board 124 is shown in FIG. 11. In block S1102, the first threaded section 146 of the standoff component 130 is secured to the circuit board 124 as shown in an embodiment in FIG. 5. In block S1104, the second threaded section 148 of the standoff component 130 is secured to the head sink 102 at a middle portion of the heat sink 102 as shown in the embodiments in FIGS. 4, 5, and 10. In block S1106, one or more attachment devices are secured to the circuit board 124 at a peripheral portion of the heat sink 102. For example, the attachment devices 114a and 114b can be secured to the circuit board 124 at a peripheral portion of the heat sink 102 as shown in an embodiment in FIG. 4. In an embodiment, one or more blocks of the process depicted in the embodiment shown in FIG. 11 may be implemented, partially or fully, by a computer-controlled machine for manufacturing/assembling computers or motherboards. Also, in some embodiments, one or more blocks of the process depicted in the embodiment shown in FIG. 11 may be performed manually.

Figure 12:
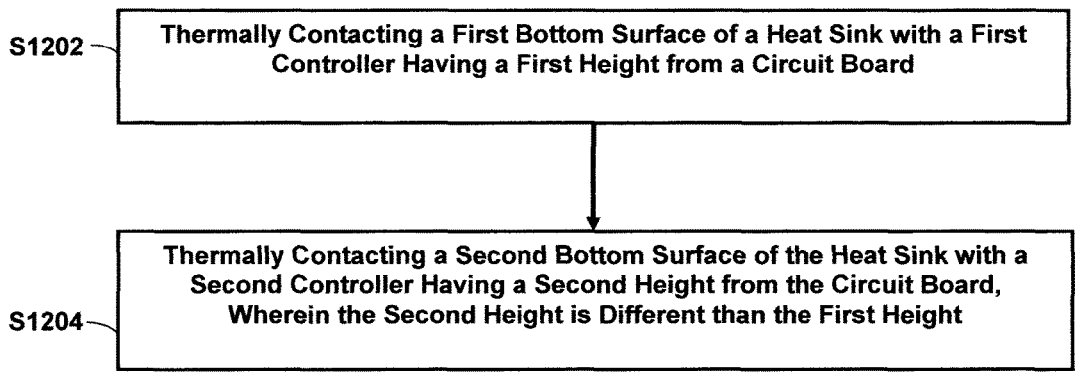
FIG. 12 depicts a process for removing heat from a first controller and a second controller according to an embodiment.

In an embodiment a process for removing heat from the first controller 126 and the second controller 128 are shown in FIG. 12. In block S1202, the first bottom surface 120 of the heat sink 102 is thermally contacted with the first controller 126 as shown in an embodiment in FIG. 5. In block S1204, the second bottom surface 122 of the heat sink 102 is thermally contacted with the second controller 128 as shown in an embodiment in FIG. 5. In an embodiment, one or more blocks of the process depicted in the embodiment shown in FIG. 12 may be implemented, partially or fully, by a computer-controlled machine for manufacturing/assembling computers or motherboards. Also, in some embodiments, one or more blocks of the process depicted in the embodiment shown in FIG. 12 may be performed manually.

Figure 13:
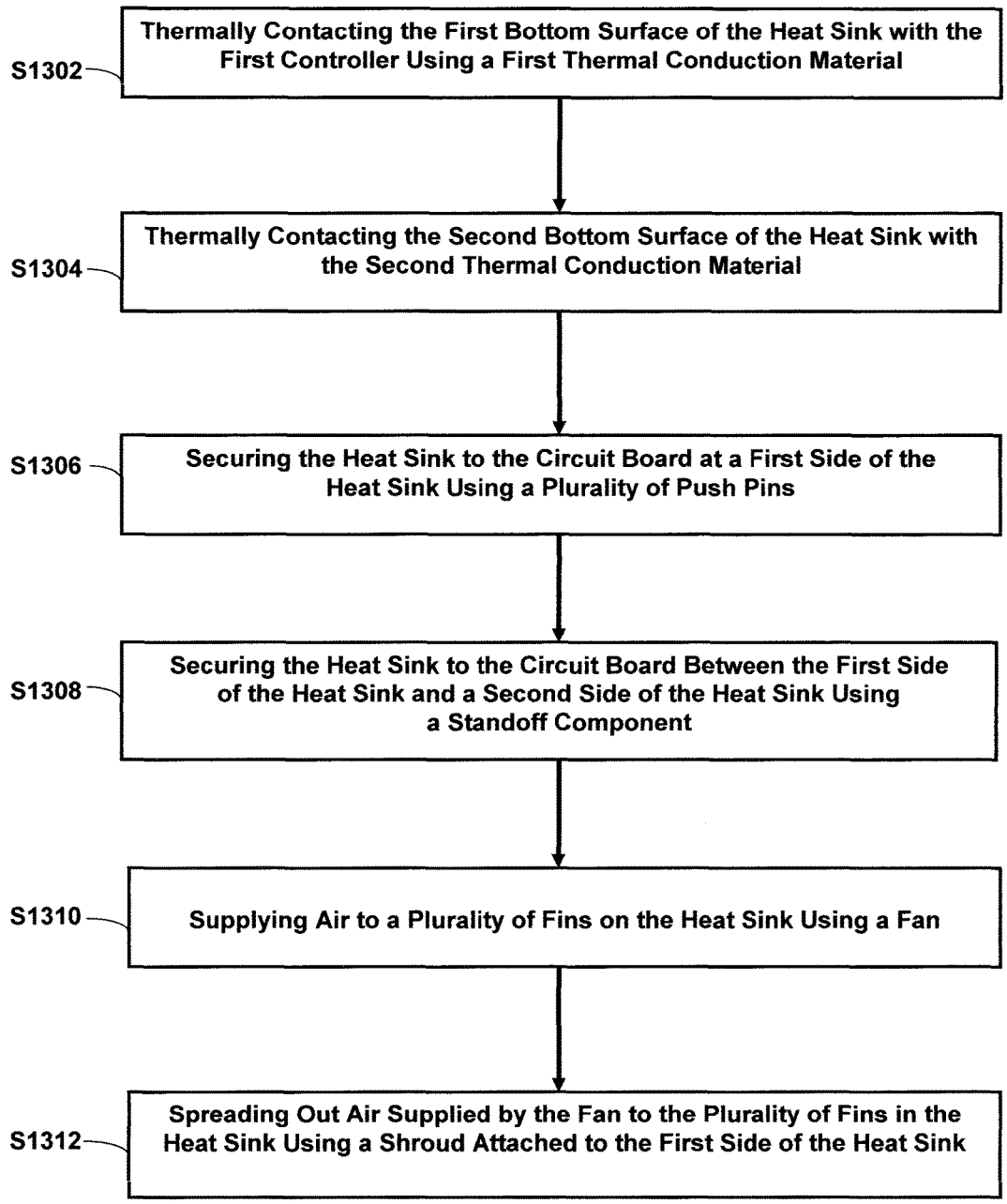
FIG. 13 depicts additional blocks for a process for removing heat from a first controller and a second controller according to an embodiment.

In an embodiment additional or optional blocks for a process for removing heat from the first controller 126 and the second controller 128 are shown in FIG. 13. In block S1302, the first bottom surface 120 of the heat sink 102 is thermally contacted with the first controller 126 using the first thermal conduction material 140 as shown in an embodiment in FIG. 5. In block S1304, the second bottom surface 122 of the heat sink 102 is thermally contacted with the second controller 128 using the second thermal conduction material 142 as shown in an embodiment in FIG. 5. In block S1306, the heat sink 102 is secured to the circuit board 124 at the first side 112 of the heat sink 102 using a plurality of push pins. For example, the attachment devices 114a and 114b can comprise push pins.

In block S1308, the heat sink 102 can be secured to the circuit board 124 using the standoff component 130 between the first side 112 of the heat sink 102 and the second side 108 of the heat sink 102 using the standoff component 130 as shown in an embodiment in FIG. 4. In block S1310, air is supplied to the plurality of fins 162 on the heat sink 102 using the fan 118 as shown in the embodiments in FIGS. 1A and 1B. In block S1312, air supplied by the fan 118 is spread out to the plurality of fins 162 in the heat sink 102 using the shroud 116 attached to the first side 112 of the heat sink 102. In an embodiment, one or more blocks of the process depicted in the embodiment shown in FIG. 13 may be implemented, partially or fully, by a computer-controlled machine for manufacturing/assembling computers or motherboards. Also, in some embodiments, one or more blocks of the process depicted in the embodiment shown in FIG. 13 may be performed manually.

Those of ordinary skill would appreciate that the various illustrative logical blocks, modules, and algorithm parts described in connection with the examples disclosed herein may be implemented as electronic hardware, computer software, or combinations of both. Furthermore, the embodiments can also be embodied on a non-transitory machine readable medium causing a processor or computer to perform or execute certain functions.

To clearly illustrate this interchangeability of hardware and software, various illustrative components, blocks, modules, circuits, and process parts have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosed apparatus and methods.

The parts of a method or algorithm described in connection with the examples disclosed herein may be embodied directly in hardware, in a software module executed by a processor, or in a combination of the two. The parts of the method or algorithm may also be performed in an alternate order from those provided in the examples. A software module may reside in RAM memory, flash memory, ROM memory, EPROM memory, EEPROM memory, registers, hard disk, a removable disk, an optical disk, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit (ASIC).

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the disclosure is, therefore, indicated by the appended claims rather than by the foregoing description. All changes which come within the meaning and range of equivalency of the claims are to be embraced within their scope.

What is claimed is:

1. A computer system comprising:
   a circuit board;
   a first heat source, the first heat source being configured to be secured to the circuit board and to have a first height from the circuit board when secured to the circuit board;
   a second heat source, the second heat source being configured to be secured to the circuit board and to have a second height from the circuit board when secured to the circuit board, the second height different than the first height; and a heat sink comprising:
- a top surface;
- a first side;
- a second side opposite the first side;
- a first bottom surface configured to thermally contact the first heat source;
- a second bottom surface configured to thermally contact the second heat source;
- a plurality of fins extending from the top surface away from the first and second heat sources, wherein:
  - at least some of the plurality of fins extend, along the top surface, from the first side to the second side; and
  - at least some of the plurality of fins collectively define an aperture that exposes a portion of the top surface that is disposed at least partly between the first and second bottom surfaces, the aperture for a standoff component for fastening the heat sink to the circuit board;
- a shroud located on the top surface of the heat sink and covering the first side; and
- a fan attached to the shroud and fitted in a notch of the heat sink, wherein a bottom surface of the fan is flush with the first bottom surface.

2. The computer system of claim 1, wherein:
the fan is configured to supply air into the shroud; and
the shroud is configured to spread out the air supplied by the fan over the plurality of fins.

3. The computer system of claim 1, wherein the heat sink further comprises:
a plurality of push pins configured to secure the heat sink to the circuit board at the first side of the heat sink; and
the standoff component is configured to secure the heat sink to the circuit board between the first side and the second side of the heat sink.

4. The computer system of claim 3, wherein:
the first bottom surface is configured to thermally contact the first heat source between the plurality of push pins and the standoff component.

5. The computer system of claim 3, wherein:
the second bottom surface is configured to thermally contact the second heat source between the standoff component and the second side.

6. The computer system of claim 1, wherein:
at least one of the first and second heat sources comprises a controller.

7. A device, comprising:
a top surface;
a first side;
a second side opposite the first side;
a first bottom surface configured to thermally contact a first heat source that is configured to be secured to a circuit board and to have a first height from the circuit board when secured to the circuit board;
a second bottom surface configured to thermally contact a second heat source that is configured to be secured to the circuit board and to have a second height from the circuit board when secured to the circuit board, the second height different than the first height;
a plurality of fins extending from the top surface away from the first and second bottom surfaces, wherein:
at least some of the plurality of fins extend, along the top surface, from the first side to the second side; and
at least some of the plurality of fins collectively define an aperture that exposes a portion of the top surface that is disposed at least partly between the first and second bottom surfaces, the aperture for a standoff component for fastening the heat sink to the circuit board;
a shroud located on the top surface of the device and covering the first side; and
a fan attached to the shroud and fitted in a notch of the device, wherein a bottom surface of the fan is flush with the first bottom surface.

8. The device of claim 7, wherein:
the fan is configured to supply air into the shroud; and
the shroud is configured to spread out the air supplied by the fan over the plurality of fins.

9. The device of claim 7, further comprising:
a plurality of push pins configured to secure the device to the circuit board at the first side of the device; and
the standoff component is configured to secure the device to the circuit board between the first side and the second side of the device.

10. The device of claim 9, wherein:
the first bottom surface is configured to thermally contact the first heat source between the plurality of push pins and the standoff component.

11. The device of claim 9, wherein:
the second bottom surface is configured to thermally contact the second heat source between the standoff component and the second side.

12. The device of claim 7, wherein:
at least one of the first and second heat sources comprises a controller.

13. A method of removing heat from a first heat source and a second heat source attached to a circuit board, the method comprising:
thermally contacting a first bottom surface of a heat sink and the first heat source, the first heat source having a first height from the circuit board;
thermally contacting a second bottom surface of the heat sink and the second heat source, the second heat source having a second height from the circuit board, the second height different than the first height;
providing a plurality of fins on a top surface of the heat sink, the top surface facing the first and second bottom surfaces and extending from a first side of the heat sink to a second side of the heat sink, at least some of the plurality of fins collectively defining an aperture that exposes a portion of the top surface that is disposed at least partly between the first and second bottom surfaces;
securing the heat sink to the circuit board using at least a standoff component disposed within the aperture, the standoff component being configured to extend at least from the top surface to the circuit board; and
supplying air to the plurality of fins using at least:
a shroud located on the top surface and covering the first side; and
a fan attached to the shroud and fitted in a notch of the heat sink, wherein a bottom surface of the fan is flush with the first bottom surface.

14. The method of claim 13, further comprising:
attaching the shroud to the heat sink; and
spreading out the supplied air over the plurality of fins using the shroud.

15. The method of claim 13, further comprising:
thermally contacting the first bottom surface of the heat sink and the first heat source using a first thermal conduction material; and
thermally contacting the second bottom surface of the heat sink and the second heat source using a second thermal conduction material.

16. The method of claim 15, wherein:
each of the first and second thermal conduction materials comprises one of a thermal paste and a thermal pad.

* * * * *